United States Patent [19]
Dazai

[11] Patent Number: 5,192,880
[45] Date of Patent: Mar. 9, 1993

[54] HIGH-SPEED EMITTER COUPLED LOGIC CIRCUIT WITH LARGE CURRENT DRIVING CAPABILITY

[75] Inventor: Teiji Dazai, Tokyo, Japan
[73] Assignee: NEC Corporation, Tokyo, Japan
[21] Appl. No.: 791,065
[22] Filed: Nov. 12, 1991
[30] Foreign Application Priority Data
  Nov. 13, 1990 [JP] Japan .................................. 2-306556
  Feb. 22, 1991 [JP] Japan .................................... 3-28473
[51] Int. Cl.$^5$ ...................................................... 307 270
[52] U.S. Cl. ...................................................... 307/455
[58] Field of Search ................. H03K/19/086, 17/04; 307/455, 454, 270

[56] References Cited
U.S. PATENT DOCUMENTS
  4,039,867  8/1977 Blumberg et al. ................... 307/455
  4,680,480  7/1987 Hopta .................................... 307/455
  4,980,582 12/1990 Waller et al. ........................ 307/455

Primary Examiner—Edward P. Westin
Assistant Examiner—Richard Roseen

[57] ABSTRACT

An emitter coupled logic circuit comprises a switching gate stage coupled with an input node and operative to carry out a logical operation on an input signal for producing a pair of intermediate signals, and an output stage having a first series combination of an emitter follower associated with an inverted output node, a first n-p-n type bipolar transistor and a resistor coupled between a ground voltage line and a negative power voltage line and a second series combination of an emitter follower associated with a non-inverted output node, a second n-p-n type bipolar transistor and a resistor coupled between the ground voltage line and the negative power voltage line, wherein the input node is coupled with the base node of the first n-p-n type bipolar transistor and the inverted output node is coupled with the base node of the second n-p-n type bipolar transistor so that the input signal is relayed to each of the emitter followers by means of a double signal path, thereby increasing the switching speed.

10 Claims, 8 Drawing Sheets

HIGH-SPEED EMITTER COUPLED LOGIC CIRCUIT WITH LARGE CURRENT DRIVING CAPABILITY

FIELD OF THE INVENTION

This invention relates to an emitter coupled logic circuit and, more particularly, to a high-speed emitter coupled logic circuit for achieving large current driving capability without sacrifice of simple circuit arrangement.

DESCRIPTION OF THE RELATED ART

A typical example of the emitter coupled logic circuit is illustrated in FIG. 1, and largely comprises a switching gate stage 1 provided in association with an input node IN1, and an output stage 2 associated with two output nodes OUT1 and OUT2. The switching gate stage 1 comprises two series combinations of resistors R1 and R2 and n-p-n type bipolar transistors Q1 and Q2 coupled in parallel between a ground voltage line GND and a common emitter node N1, and a series combination of an n-p-n type bipolar transistor Q3 and a resistor R3 coupled between the common emitter node N1 and a first negative voltage line Vee. A constant voltage level Vcs1 is supplied to the base node of the n-p-n type bipolar transistor Q3, and the series combination of the n-p-n type bipolar transistor Q3 and the resistor R3 serves as a constant current source. The input node IN1 is coupled with the base node of the n-p-n type bipolar transistor Q1, and a reference voltage level Vr1 is supplied to the base node of the n-p-n type bipolar transistor Q1, The output stage 2 comprises two series combinations of n-p-n type bipolar transistors Q4 and Q5 and resistors R4 and R5 coupled between the ground voltage line GND and a second negative voltage line Vt, and the base nodes of the n-p-n type bipolar transistors Q4 and Q5 are coupled with the collector nodes of the n-p-n type bipolar transistors Q1 and Q2, respectively. The output nodes OUT1 and OUT2 are coupled with the emitter nodes of the n-p-n type bipolar transistors Q4 and Q5, respectively.

While an input signal at the input node IN1 is higher than the reference voltage level Vr1, the n-p-n bipolar transistor Q1 turns on, and the n-p-n bipolar transistor Q2 turns off. While the n-p-n bipolar transistor Q1 is turned on, the voltage level at the base node of the n-p-n type bipolar transistor hardly exceeds the emitter-base forward bias voltage, and the n-p-n bipolar transistor Q4 turns off. This results in a lower voltage level at the output node OUT1. On the other hand, the n-p-n type bipolar transistor Q2 in the off-state lifts the voltage level at the base node of the n-p-n type bipolar transistor Q5, and the n-p-n type bipolar transistor Q5 turns on. Then, the output node OUT2 is elevated to a high voltage level, and the input signal higher than the reference voltage level Vr1 results in the low voltage level at the output node OUT1 and the high voltage level at the output node OUT2. The input signal lower than the reference voltage level results in the output nodes OUT1 and OUT2 opposite to those described hereinbefore.

FIG. 2 shows a modification of the prior art emitter coupled logic circuit shown in FIG. 1, and a negative power voltage line Vee is shared between the switching gate stage 1 and the output stage 2. However, the other circuit arrangement is similar to the prior art emitter coupled logic circuit, and the circuit components are labeled with the same references used in FIG. 1 without any detailed description. The modification behaves as similar to the prior art emitter coupled logic circuit, and description is omitted for the sake of simplicity.

In the prior art emitter coupled logic circuits shown in FIGS. 1 and 2, the current driving capability is varied with the input signal. Namely, when the output node OUT1 is switched from the high voltage level to the low voltage level, the capacitive load coupled with the output node OUT1 is discharged through the resistor R4 to the negative voltage line Vt or Vee. However, the capacitive load has been charged through the n-p-n type bipolar transistor Q4, and the output node OUT1 hardly exceeds a certain voltage level lower than the ground voltage line GND by the emitter-base forward bias voltage. However, the current driving capability of the output stage 2 is increased by means of the n-p-n type field effect transistors Q4 and Q5 upon switching from the low voltage level to the high voltage level. Thus, the current driving capability of the output stage 2 is varied, and the difference in current driving capability is inconvenient for circuit designers.

Turning to FIG. 3 of the drawings, yet another prior art emitter coupled logic circuit is illustrated, and the emitter coupled logic circuit shown in FIG. 3 aims at overcoming the drawback inherent in the prior art emitter coupled logic circuits shown in FIGS. 1 and 2. The emitter coupled logic circuit largely comprises a switching gate stage 3 coupled with an input node IN2, and an output stage 4 provided in association with output nodes OUT3 and OUT4. The switching gate stage 3 comprises two series combinations of resistors R6 and R7 and n-p-n type bipolar transistors Q6 and Q7 coupled between a ground voltage line GND and a common emitter node N2, and a series combination of an n-p-n type bipolar transistor Q8 and a resistor R8 coupled between the common emitter node and a negative power voltage line Vee. The input node IN2 is coupled with the base node of the n-p-n type bipolar transistor Q6, and a reference voltage level Vr2 is applied to the base node of the n-p-n type bipolar transistor Q7.

The output stage 4 comprises two series combinations of n-p-n type bipolar transistors Q9, Q10, Q11 and Q12 and resistors R9 and R10 coupled between the ground voltage line GND and the negative power voltage line Vee. The base nodes of the n-p-n type bipolar transistors Q9 and Q10 are coupled with the collector nodes of the n-p-n type bipolar transistors Q6 and Q7, respectively, and the output nodes OUT3 and OUT4 are coupled with the emitter nodes of the n-p-n type bipolar transistors Q9 and Q10, respectively. A control voltage level Vcs2 are supplied to the base nodes of the n-p-n type bipolar transistors Q8, Q11 and Q12, and, for this reason, not only the switching gate stage 3 but also the two series combinations of the output stage 4 have constant current sources. However, the circuit behavior is similar to that of the prior art shown in FIG. 1, and, for this reason, detailed description is not incorporated hereinbelow for the sake of simplicity.

The emitter coupled logic circuits achieve high switching action, because the n-p-n bipolar transistors yield the output signals. Moreover, the output stages 2 and 4 are implemented by pairs of emitter follower circuits, respectively, and, accordingly, the emitter coupled logic circuits have large current driving capability. Thus, the emitter coupled logic circuits are attractive to circuit designers.

However, higher switching action and larger current driving capability are continuously requested by circuit designers, and Kai-Yap Toh et al of IBM Corporation proposed an output stage implemented by an active pull-down emitter follower circuit in proceedings of IEEE International Solid-State Circuits Conference, 1989, pages 224 to 225. FIG. 4 shows an emitter coupled logic circuit with the active pull-down emitter follower circuit, and the emitter coupled logic circuit largely comprises a switching gate stage 5 associated with an input node IN3, and an output stage 6 associated with an output node OUT5. The switching gate stage 5 comprises two series combinations of resistors R11 and R12 and n-p-n type bipolar transistors Q13 and Q14 coupled between a ground voltage line GND and a common emitter node N3, and a series combination of an n-p-n type bipolar transistor Q15 and a resistor R13 coupled between the common emitter node N3 and a negative power voltage line Vee. The input node IN3 is coupled with the base node of the n-p-n type bipolar transistor Q13, and a reference voltage level Vr3 is applied to the base node of the n-p-n type bipolar transistor Q14. A controlling voltage level Vcs3 is applied to the base node of the n-p-n type bipolar transistor Q15, and causes the n-p-n type bipolar transistor Q15 to serve as a constant current source. The output stage 6 is implemented by the active pull-down emitter follower circuit. Namely, a series combination of n-p-n type bipolar transistors Q16 and Q17 and a resistor R14 is coupled between the ground voltage line GND and the negative power voltage line Vee, and a speed-up capacitor C1 is coupled in parallel to the resistor R14. The base nodes of the n-p-n type bipolar transistors Q16 and Q17 are electrically coupled with the collector nodes of the n-p-n type bipolar transistors Q13 and Q14, respectively. Although the base node of the n-p-n type bipolar transistor Q16 is directly coupled with the collector node of the n-p-n type bipolar transistor Q13, the base node of the n-p-n type bipolar transistor Q17 is coupled through a capacitor C2 with the collector node of the n-p-n type bipolar transistor Q14, and is supported by a series combination of diodes D1 and D2 and a pinched-base resistor R15. By virtue of the AC coupling between the n-p-n type bipolar transistors Q14 and Q17, the n-p-n type bipolar transistor Q17 rapidly discharges a capacitive load CL. Namely, when the input signal at the input node IN3 exceeds the reference voltage level Vr3, the n-p-n type bipolar transistor Q13 turns on, and the n-p-n type bipolar transistor Q14 turns off. The switching actions result in that the n-p-n type bipolar transistors Q16 and 17 turn off and on, respectively. At the moment, the capacitor C2 lifts the voltage level at the base node of the n-p-n type bipolar transistor Q17, and, accordingly, the n-p-n type bipolar transistor Q17 provides large conductance from the capacitive load CL toward the negative power voltage line Vee. For this reason, the output stage 6 implemented by the pull-down emitter follower circuit speeds up the switching action of the emitter coupled logic circuit.

However, the pull-down emitter follower circuit is fabricated from two n-p-n type bipolar transistors, two diodes, two capacitors and two resistors. Therefore, one of the problems inherent in the emitter coupled logic circuit proposed by Kai-Yap Toh et al is low integration density when the emitter coupled logic circuits are integrated. Another problem is difficult design work. In order to achieve high-speed switching action, not only the capacitor C2 but also the speed-up capacitor C1 should be optimized, and the optimization is not easy for circuit designers.

SUMMARY OF THE INVENTION

It is therefore an important object of the present invention to provide an emitter coupled logic circuit which achieves high-speed switching action without sacrifice of simple circuit arrangement.

To accomplish these objects, the present invention proposes to double a signal path from an input node to an emitter follower circuit associated with an output node.

In accordance with the present invention, there is provided an emitter coupled logic circuit comprising a) a switching gate stage coupled with an input port, and operative to carry out a logical operation so as to produce a pair of intermediate signals complementary in logic level to each other, and b) an output stage having a first series combination of a first emitter follower associated with a first output node, a first bipolar transistor and a first resistor coupled between first and second constant voltage lines different in voltage level from each other, and a second series combination of a second emitter follower associated with a second output nodes, a second bipolar transistor and a second resistor coupled between the first and second constant voltage lines, the first and second emitter followers being controlled by the pair of intermediate signals, the base node of the first bipolar transistor being coupled with the input port, the base node of the second bipolar transistor being coupled with the first output node.

BRIEF DESCRIPTION OF THE DRAWINGS

The features and advantages of the emitter coupled logic according to the present invention will be more clearly understood from the following description taken in conjunction with the accompanying drawings in which.

DESCRIPTION OF THE PREFERRED EMBODIMENTS

First Embodiment

Figure 1:
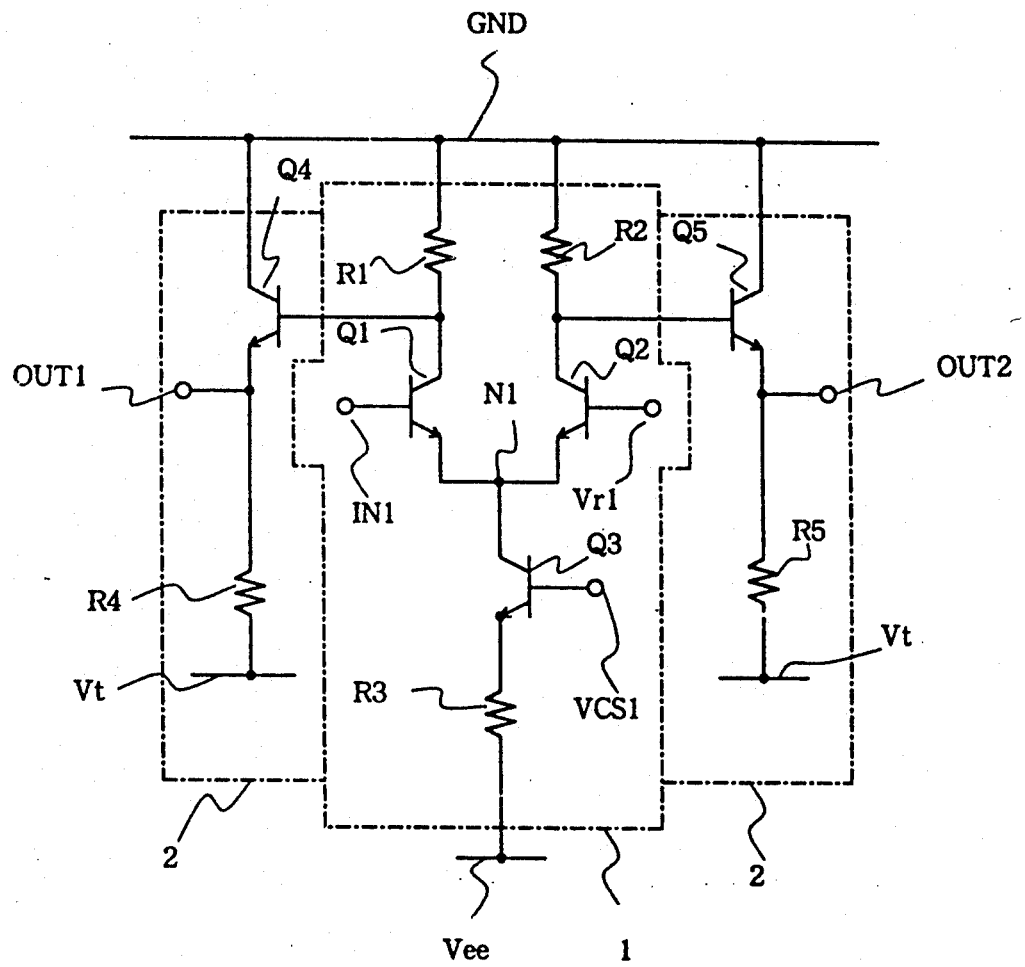
FIG. 1 is a circuit diagram showing the arrangement of the prior art emitter coupled logic circuit.
Figure 2:
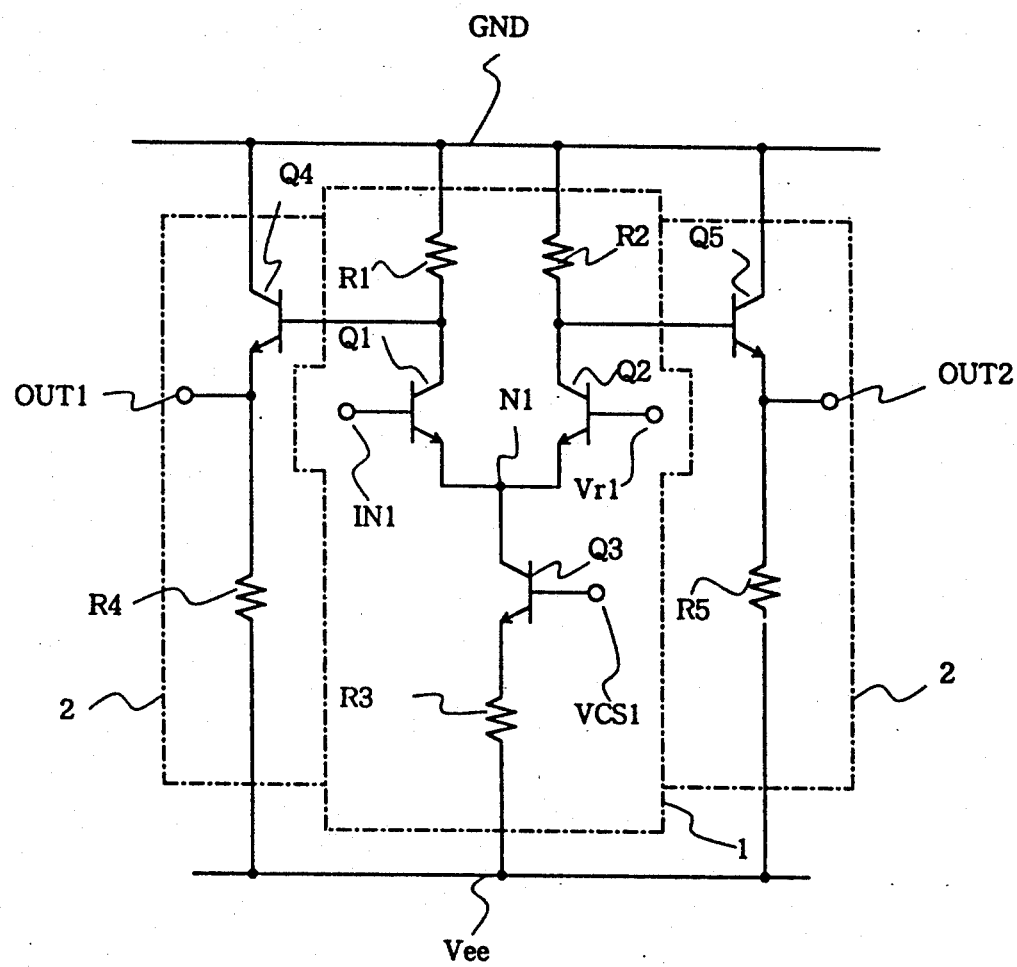
FIG. 2 is a circuit diagram showing the modification of the prior art emitter coupled logic circuit.
Figure 3:
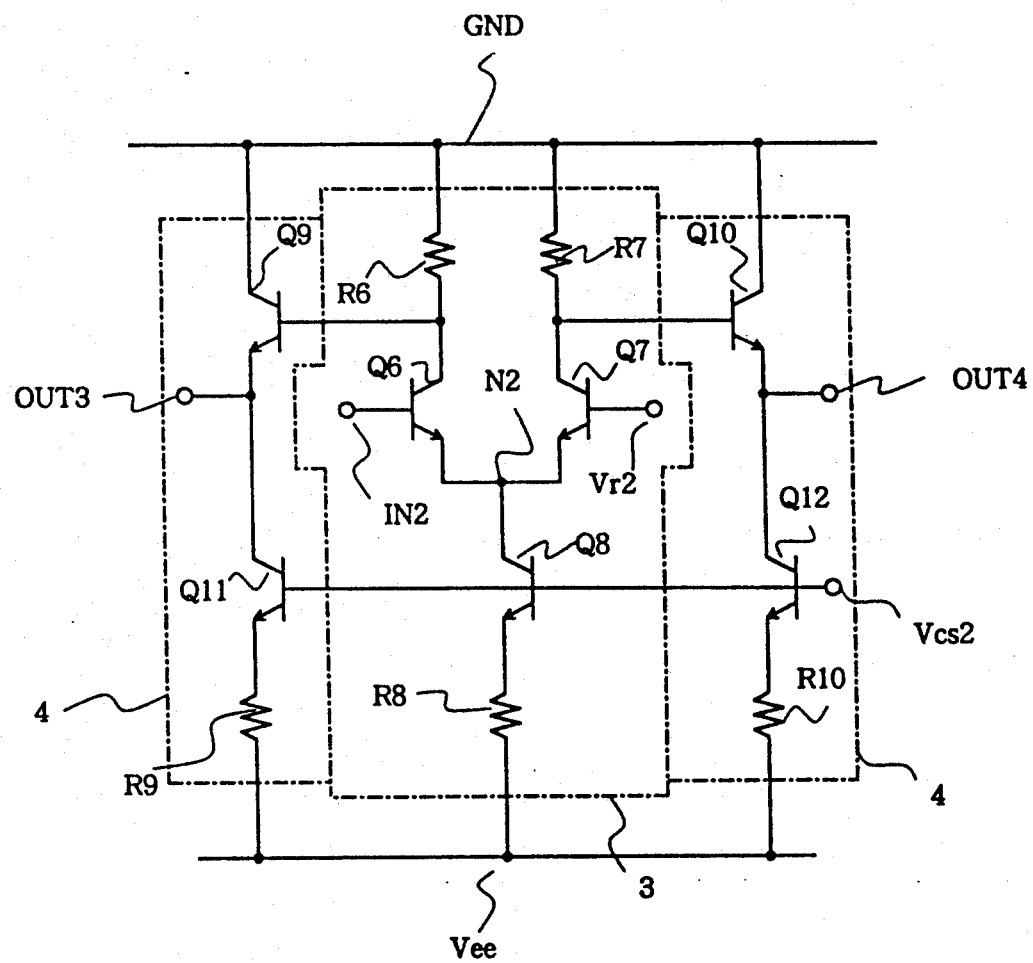
FIG. 3 is a circuit diagram showing another prior art emitter coupled logic circuit.
Figure 4:
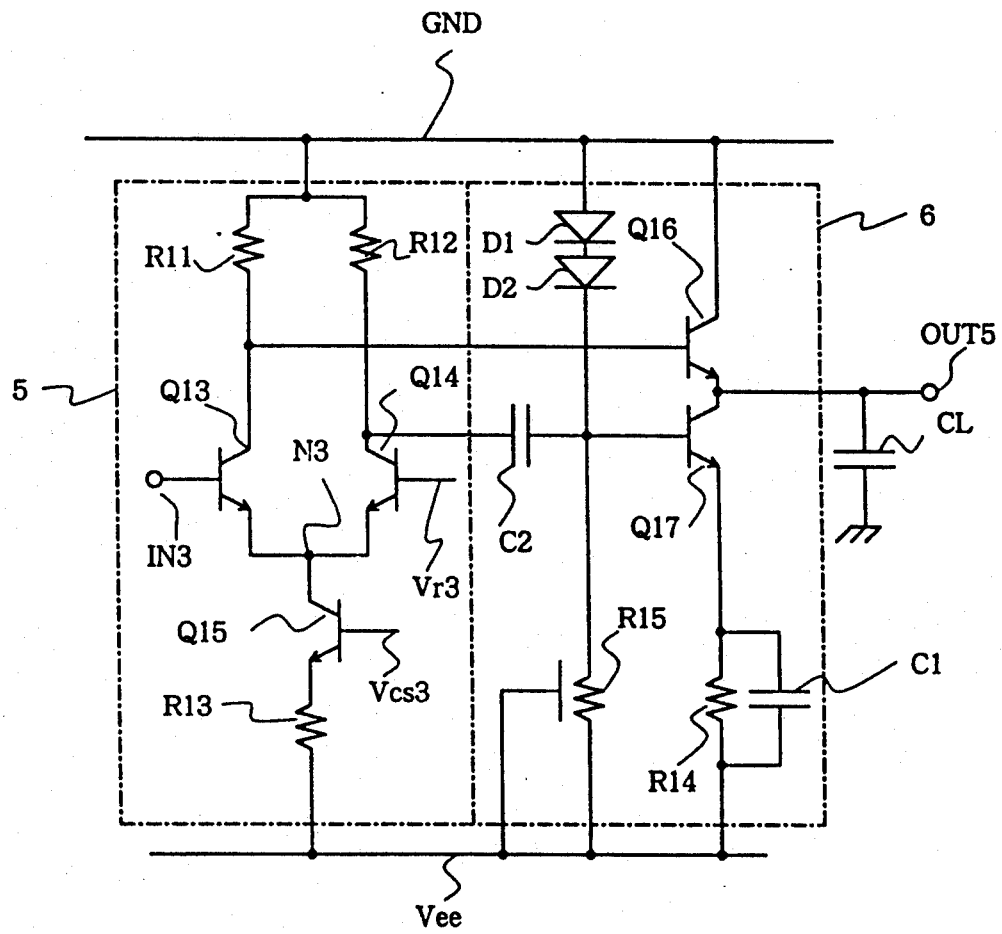
FIG. 4 is a circuit diagram showing the arrangement of the prior art emitter coupled logic circuit with the active pull-down emitter follower circuit proposed by Kai-Yap Toh et al of IBM Corporation.
Figure 5:
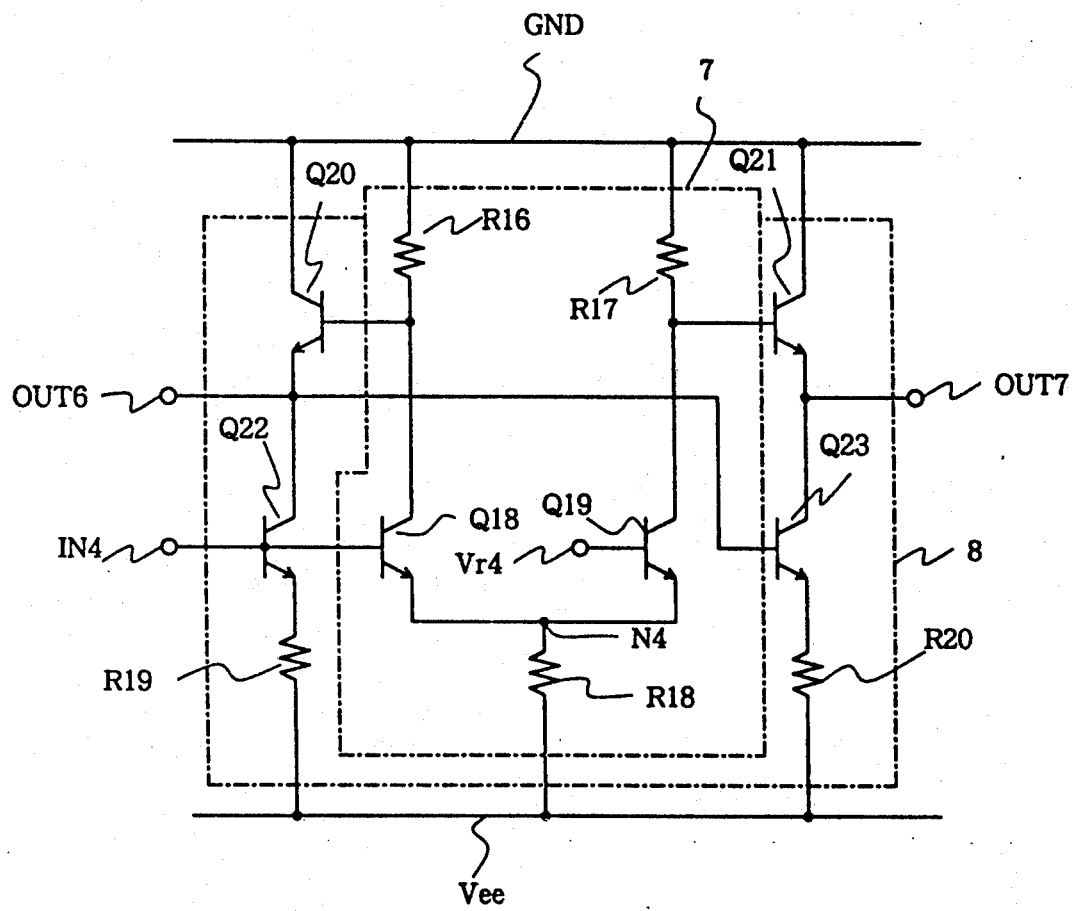
FIG. 5 is a circuit diagram showing the circuit arrangement of an emitter coupled logic circuit according to the present invention.

Referring to FIG. 5 of the drawings, an emitter coupled logic circuit embodying the present invention largely comprises a switching gate stage 7 associated with an input node IN, and an output stage 8 provided in association with inverted and non-inverted output nodes OUT6 and OUT7. The switching gate stage 7 comprises two series combinations of resistors R16 and R17 and n-p-n type bipolar transistors Q18 and Q19 coupled in parallel between a ground voltage line GND and a common emitter node N4, and a resistor R18 coupled between the common emitter node N4 and a negative power voltage line Vee. The input node IN4 is coupled with the base node of the n-p-n type bipolar transistor Q18, and a reference voltage level Vr4 is applied to the base node of the n-p-n type bipolar transistor Q19. The n-p-n type bipolar transistor Q3, Q8 or Q15 is replaced with the resistor R18, and the negative power voltage line Vee is closer to the ground voltage than those of the prior art emitter coupled logic circuits because of the emitter-base forward bias voltage thereof. This results in reduction of current consumption.

The output stage 8 comprises two series combinations of n-p-n type bipolar transistors Q20 and Q21, n-p-n type bipolar transistors Q22 ad Q23 and resistors R19 and R20 coupled in parallel between the ground voltage line GND and the negative power voltage line Vee. The base nodes of the n-p-n type bipolar transistors Q20 and Q21 are coupled with the collector nodes of the n-p-n type bipolar transistors Q18 and Q19, respectively, and the inverted and the non-inverted output nodes OUT6 and OUT7 are respectively coupled with the emitter nodes of the n-p-n type bipolar transistors Q20 and Q21. The input node IN4 is further coupled with the base node of the n-p-n type bipolar transistor Q22, and the inverted output node OUT6 extends to the base node of the n-p-n type bipolar transistor Q23.

Description is hereinbelow made on the circuit behavior of the emitter coupled logic circuit. Assuming now that an input signal at the input node IN4 is shifted from a low voltage level to a high voltage level. In other words, the input signal exceeds the reference voltage level Vr4, and reaches the high voltage level. The n-p-n type bipolar transistors Q18 and Q19 turn on and off, and the voltage levels at the collector nodes thereof go down and up, respectively. Since the input signal also allows the n-p-n type bipolar transistor Q22 to turn on, the inverted output node OUT6 is conducted through the n-p-n type bipolar transistor Q22 to the negative power voltage line Vee, and a capacitive load coupled to the inverted output node OUT6 is rapidly discharged for producing a low voltage level at the inverted output node OUT6. On the other hand, the voltage level at the collector node of the n-p-n type bipolar transistor Q19 is lifted upon turning-off of the n-p-n type bipolar transistor Q19, and the n-p-n type bipolar transistor Q21 turns on to couple the ground voltage line to the non-inverted output node OUT7. Since the voltage level at the inverted output node OUT6 is supplied to the base node of the n-p-n type bipolar transistor Q23, the n-p-n type bipolar transistor Q23 turns off to isolate the non-inverted output node OUT7 from the negative power voltage line Vee. As a result, a capacitive load coupled to the non-inverted output node OUT7 is charged, and the non-inverted output node OUT7 is elevated to a high voltage level. As will be understood from the foregoing description, the double signal propagation path is provided for each of the inverted and non-inverted output nodes OUT6 and OUT7, and the double signal propagation paths improve the switching speed. Namely, the alternation of the input signal is firstly propagated from the input node IN4 to the base node of the n-p-n type bipolar transistor Q18, then the base of the n-p-n type bipolar transistor being responsive to the alternation, the collector node following the base, alternation of voltage level taking place at the base node of the n-p-n type bipolar transistor Q20 through the resistor R16, then base of the n-p-n type bipolar transistor Q20 being responsive, thereby allowing the emitter follower circuit to alternating the voltage level at the inverted output node OUT6. Let us refer the signal path from the base node of the n-p-n type bipolar transistor Q18 to the non-inverted output node OUT6 to as "first signal path". A second signal path is further provided in parallel to the first signal path. Namely, the alternation of the input signal causes the base of the n-p-n type bipolar transistor Q22 to be responsive, then the collector node following the base, thereby allowing the emitter follower circuit to alternate the voltage level at the inverted output node OUT6. The non-inverted output node OUT7 is also associated with double signal propagation path. Namely, the first signal path starts from the base node of the n-p-n type bipolar transistor Q18 through the common emitter node N4, the base and collector nodes of the n-p-n type bipolar transistor Q19, the base of the n-p-n type bipolar transistor to the emitter follower circuit coupled to the non-inverted node. The second signal path also starts from the base of the n-p-n type bipolar transistor Q18 through the collector node thereof, the base node of the n-p-n type bipolar transistor Q20, the inverted output node OUT6 and the base of the n-p-n type bipolar transistor Q23 to the emitter follower circuit coupled with the non-inverted output node OUT7.

Thus, each of the inverted and non-inverted output nodes OUT6 and OUT7 is supported by the double signal propagation paths, and the double signal propagation paths are effectively shrunk the time period consumed by the switching action. The series combination associated with the inverted output node OUT6 is adopted to discharge a larger mount of current to the negative power voltage line Vee, and improves the switching speed from the high voltage level to the low voltage level. The emitter follower circuit associated with the non-inverted output node OUT7 is similar to that of the inverted output node OUT6. Since the voltage level at the inverted output node OUT6 is fed back to the base node of the n-p-n bipolar transistor Q23, the alternation at the non-inverted output node OUT7 is slightly delayed from that at the inverted output node OUT6. However, the effect of the double signal propagation paths is large enough to compensate the delay, and further speeds up the switching action rather than the prior art emitter coupled logic circuits.

When the input signal is switched from the high voltage level to the low voltage level, the input signal causes the n-p-n type bipolar transistors Q18 and Q19 to turn off and on, and the voltage levels at the base nodes of the n-p-n type bipolar transistors Q20 and Q21 go up and down, respectively. The n-p-n type bipolar transistor Q20 turns on, and the input signal of the low voltage level directly switches the n-p-n type bipolar transistor Q22 off. Then, the emitter follower circuit quickly charges the capacitive load coupled with the inverted output node OUT6. On the other hand, the base node of the n-p-n type bipolar transistor Q21 is lowered upon turning-on of the n-p-n type bipolar transistor Q19, and the n-p-n type bipolar transistor Q21 turns off. Since the inverted output node OUT6 of the high voltage level causes the n-p-n type bipolar transistor Q23 to turn off, the n-p-n type bipolar transistor Q21 quickly charges the capacitive load coupled with the non-inverted output node OUT7, and the non-inverted output node OUT7 goes up to the high voltage level.

Second Embodiment

Figure 6:
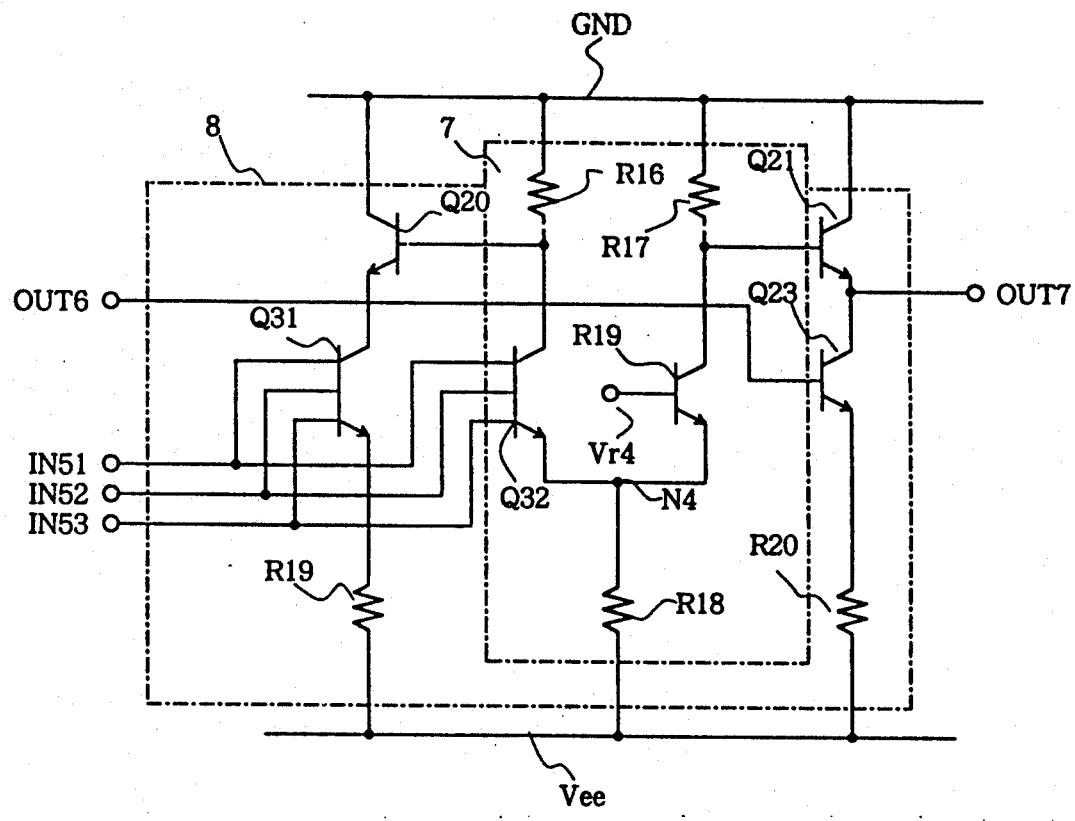
FIG. 6 is a circuit diagram showing the arrangement of another emitter coupled logic circuit according to the present invention.

Turning to FIG. 6 of the drawings, another emitter coupled logic circuit embodying the present invention is illustrated. The emitter coupled logic circuit shown in FIG. 6 is similar in circuit arrangement to the first embodiment except for multi-base n-p-n type bipolar transistors Q31 and Q32, and, for this reason, the other circuit components are labeled with the same references used in FIG. 5. The n-p-n type bipolar transistors Q18 and Q22 are respectively replaced with the multi-base n-p-n type bipolar transistors Q31 and Q32, and a plurality of input nodes IN51, IN52 and IN53 are coupled in parallel with the base nodes of the multi-base n-p-n type bipolar transistors Q31 and Q32. Therefore, the switching gate stage 7 of the second embodiment carries out an OR operation as well as a NOR operation (in the positive logic). However, the circuit behavior of the second embodiment is analogous from that of the first embodiment, and no further description is incorporated for the sake of simplicity.

Third Embodiment

Figure 7:
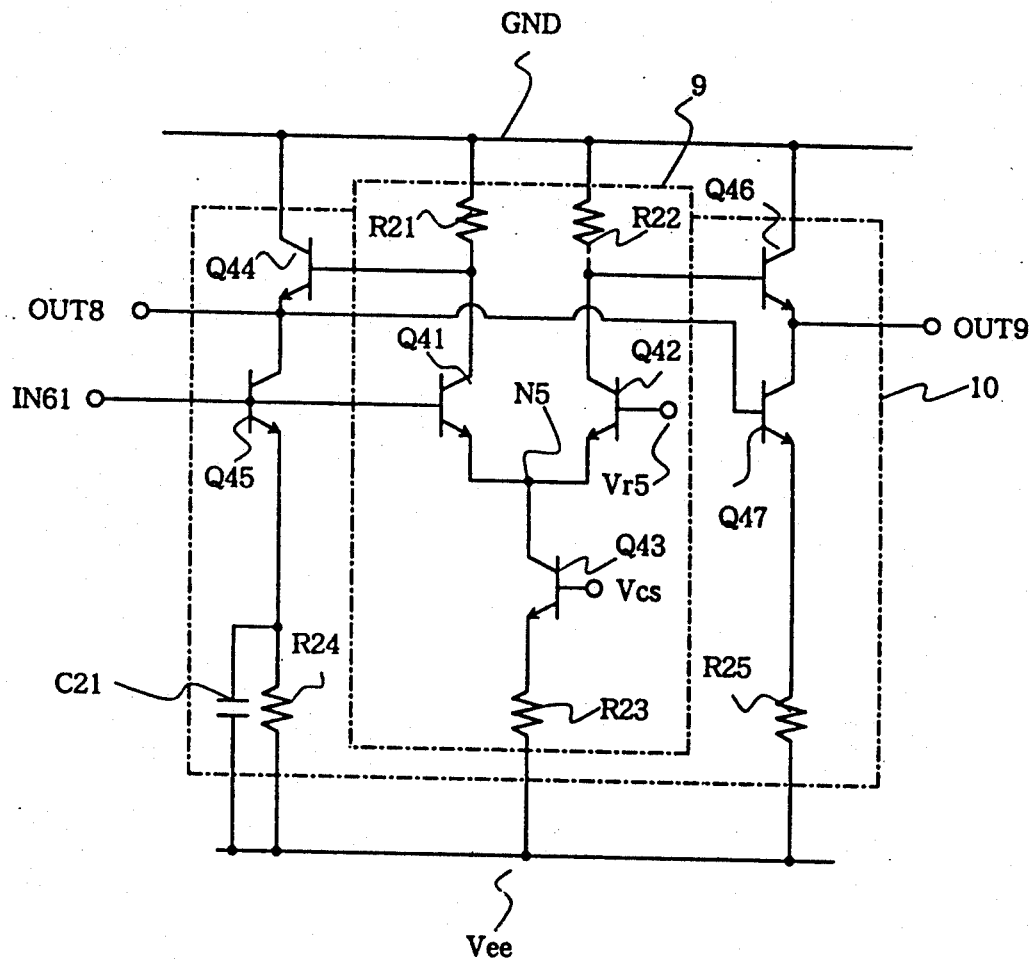
FIG. 7 is a circuit diagram showing the arrangement of yet another emitter coupled logic circuit according to the present invention.

Turning to FIG. 7 of the drawings, yet another emitter coupled logic circuit embodying the present invention also largely comprises a switching gate stage 9 and an output stage 10. The switching gate stage 9 comprises a series combination of a resistor R21 and an n-p-n type bipolar transistor Q41 coupled between a ground voltage line GND and a common emitter node N5, a series combination of a resistor R22 and an n-p-n type bipolar transistor Q42 coupled between the ground voltage line GND and the common emitter node N5, and a series combination of an n-p-n type bipolar transistor Q43 and a resistor R23 coupled between the common emitter node N5 and a negative power voltage line Vee. An input port IN61 is coupled with the base node of the n-p-n type bipolar transistor Q41, and a reference voltage level Vr5 is applied to the base node of the n-p-n type bipolar transistor Q42. A controlling voltage level Vcs is applied to the base node of the n-p-n type bipolar transistor Q43, and allows the series combination to serve as a constant current source. The n-p-n type bipolar transistors Q41 and Q42 complementarily turn on and off depending upon an input signal applied to the input port IN61. Namely, while the input signal remains lower than the reference voltage level Vr5, the n-p-n type bipolar transistor Q42 turns on, and the n-p-n type bipolar transistor Q41 remains off. However, the input signal exceeds the reference voltage level Vr5, the n-p-n type bipolar transistor Q41 turns on, and the n-p-n type bipolar transistor Q42 enters the off-state.

The output stage 10 comprises a series combination of n-p-n type bipolar transistors Q44 and Q45 and a resistor R24 coupled between the ground voltage line GND and the negative power voltage line Vee, a series combination of n-p-n type bipolar transistors Q46 and Q47 and a resistor R25 coupled between the ground voltage line GND and the negative power voltage line Vee, and a speed-up capacitor C21 coupled in parallel to the resistor R24. The collector nodes of the n-p-n type bipolar transistors Q41 and Q42 are coupled with the base nodes of the n-p-n type bipolar transistors Q44 and Q46, and the emitter nodes of the n-p-n type bipolar transistors Q44 and Q46 are coupled with a pair of output nodes OUT8 and OUT9. As similar to the first and second embodiments, the input port IN61 is further coupled with the base node of the n-p-n type bipolar transistor Q45, and the output node OUT8 is coupled with the base node of the n-p-n type bipolar transistor Q47. Therefore, double signal paths are respectively provided for the emitter followers implemented by the n-p-n type bipolar transistors Q44 and Q46, and speed up the signal propagations to the output nodes OUT8 and OUT9.

The speed-up capacitor C21 decreases AC-impedance of the resistor R24, and memontaneously increases the emitter current of the n-p-n type bipolar transistor Q45. For this reason, the switching action at the output node OUT8 is further improved when the output node OUT8 goes down.

Fourth Embodiment

Figure 8:
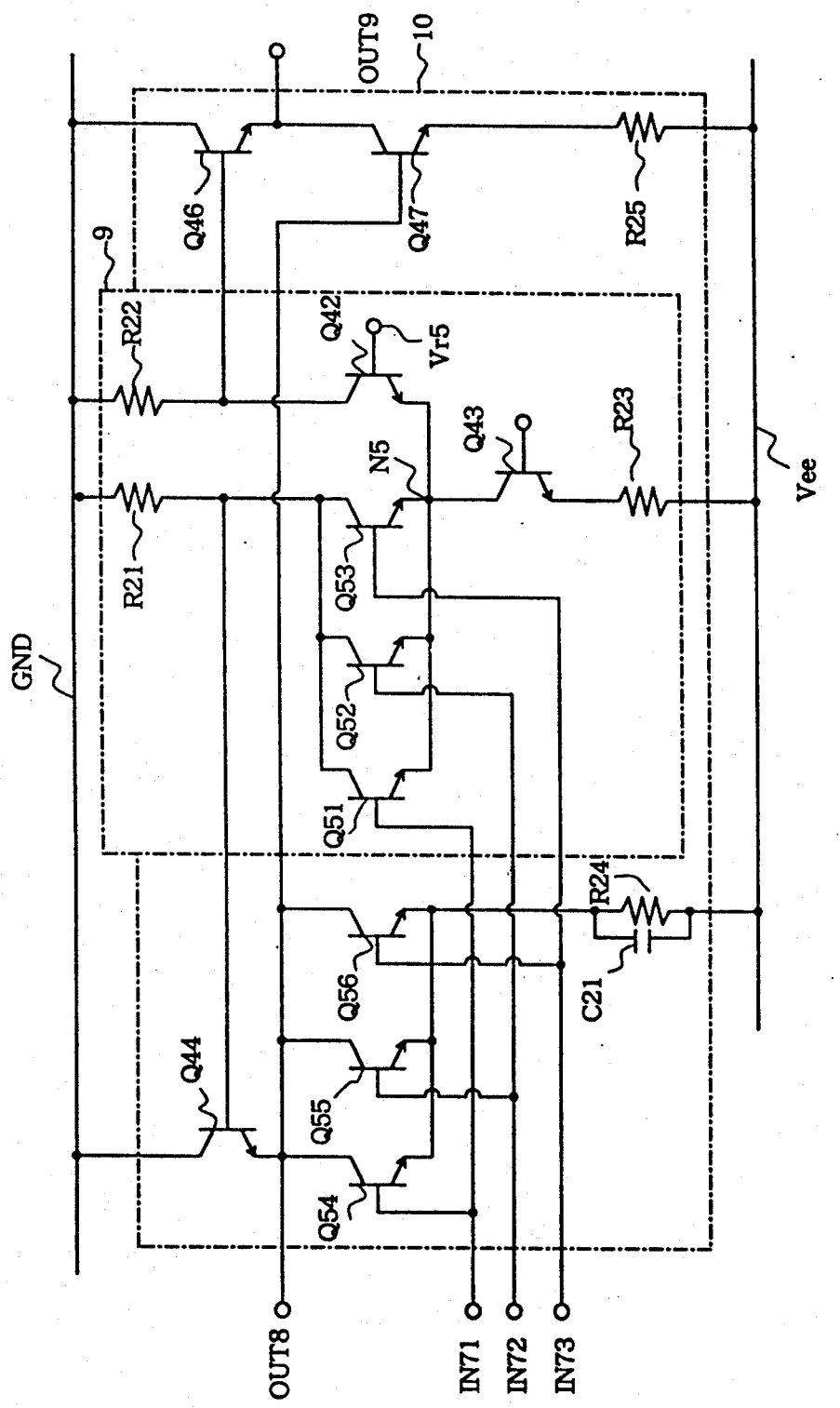
FIG. 8 is a circuit diagram showing the arrangement of yet another emitter coupled logic circuit according to the present invention.

Turning to FIG. 8 of the drawings, yet another emitter coupled logic circuit embodying the present invention is illustrated. The circuit arrangement of the emitter coupled logic circuit embodying the fourth embodiment is largely similar to that of the third embodiment. However, the n-p-n type bipolar transistors Q41 and Q45 are replaced with two sets of n-p-n type bipolar transistors Q51, Q52 and Q53, and Q54, Q55 and Q56, respectively, and an input port has three input nodes IN71, IN72 and IN73. The input nodes IN71 to IN73 are coupled in parallel with the base nodes of the n-p-n type bipolar transistors Q51 to Q53 as well as with the base nodes of the n-p-n type bipolar transistors Q54 to Q56, and the emitter coupled logic circuit implementing the fourth embodiment achieves an OR operation/ a NOR operation (in the positive logic). The other circuit components are labeled with the same references as the third embodiment, and detailed description on further circuit arrangement and circuit behavior is omitted for avoiding repetition.

As will be appreciated from the foregoing description, the emitter coupled logic circuit according to the present invention provides the double signal propagation paths to the respectively emitter followers, and the switching action is improved without sacrifice of simple circuit arrangement.

Although particular embodiments of the present invention have been shown and described, it will be obvious to those skilled in the art that various changes and modifications may be made without departing from the spirit and scope of the present invention. For example, p-n-p type bipolar transistors may be used for an emitter coupled logic circuit according to the present invention, and various logical functions may be achieved by modifying the embodiments.

What is claimed is:

1. An emitter coupled logic circuit comprising
   a) a switching gate state coupled with an input port, and operative to carry out a logical operation so as to produce a pair of intermediate signals complementary in logic level to each other,
   b) an output stage having a first series combination of a first emitter follower, a first bipolar transistor and a first resistor coupled between first and second constant voltage lines different in voltage level from each other, and a second series combination of a second emitter follower, a second bipolar transistor and a second resistor coupled between said first and second constant voltage lines, and c) a first output node and a second output node, said first and second emitter followers having emitter nodes coupled with said first and second output nodes, respectively, said first and second emitter followers being controlled by said pair of intermediate signals, a base node of said first bipolar transistor being coupled with said input port, a base node of said second bipolar transistor being coupled with said first output node.

2. An emitter coupled logic circuit as set forth in claim 1, in which said switching gate state comprises a series combination of a third resistor and a third bipolar transistor coupled between said first constant voltage line and a common node, a series combination of a fourth resistor and a fourth bipolar transistor coupled between said first constant voltage line and said common node, and a fifth resistor coupled between said common node and said second constant voltage line, said input port being coupled with the base node of said third bipolar transistor, the base node of said fourth bipolar transistor being supplied with a reference voltage level, said pair of intermediate signals being produced between said third resistor and said third bipolar transistor and between said fourth resistor and said fourth bipolar transistor.

3. An emitter coupled logic circuit as set forth in claim 2, in which said first to fourth bipolar transistors and said first and second emitter followers are implemented by n-p-n type bipolar transistors.

4. An emitter coupled logic circuit as set forth in claim 2, in which said first and third bipolar transistors are implemented by multi-base transistors, respectively.

5. An emitter coupled logic circuit as set forth in claim 4, in which said first to fourth bipolar transistors and said first and second emitter followers are implemented by n-p-n type bipolar transistors.

6. An emitter coupled logic circuit as set forth in claim 1, in which said first series combination further has a capacitor coupled in parallel to said first resistor for decreasing an AC impedance of said first resistor.

7. An emitter coupled logic circuit as set forth in claim 6, in which said switching gate stage comprises a series combination of a third resistor and a third bipolar transistor coupled between said first constant voltage line and a common node, a series combination of a fourth resistor and a fourth bipolar transistor coupled between said first constant voltage line and said common node, and a series combination of a fifth bipolar transistor and a fifth resistor coupled between said common node and said second constant voltage line, a base node of said third bipolar transistor being coupled with said input port, a base node of said fourth bipolar transistor being supplied with a reference voltage level, said pair of intermediate signals being produced between said third resistor and said third bipolar transistor and between said fifth resistor and said fifth bipolar transistor, a base node of said fifth bipolar transistor being supplied with a control voltage level so as to cause said series combination of said fifth bipolar transistor and said fifth resistor to serve as a constant current source.

8. An emitter coupled logic circuit as set forth in claim 7, in which said first to fifth bipolar transistors and said first and second emitter followers are implemented by n-p-n type bipolar transistors, respectively.

9. An emitter coupled logic circuit as set forth in claim 7, in which a group of sixth bipolar transistors are coupled between said first output node and said first resistor in parallel to said first bipolar transistor, and a group of seventh bipolar transistors are coupled between said third resistor and said fifth bipolar transistor in parallel to said third bipolar transistor, base nodes of said first and said sixth bipolar transistors being respectively coupled to input nodes of said input port, and base nodes of said third and said seventh bipolar transistors being respectively coupled to said input nodes of said input port.

10. An emitter coupled logic circuit as set forth in claim 9, in which said first, second and fifth to ninth bipolar transistors as well as said first and second emitter followers are implemented by n-p-n type bipolar transistors, respectively.

* * * * *